(12) United States Patent
Sato et al.

(10) Patent No.: US 10,668,512 B2
(45) Date of Patent: Jun. 2, 2020

(54) PARTICLE REMOVAL METHOD AND SUBSTRATE PROCESSING METHOD

(71) Applicant: Tokyo Electron Limited, Tokyo (JP)

(72) Inventors: Jun Sato, Iwate (JP); Masato Yonezawa, Iwate (JP); Takashi Chiba, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 111 days.

(21) Appl. No.: 15/841,817

(22) Filed: Dec. 14, 2017

(65) Prior Publication Data
US 2018/0169716 A1 Jun. 21, 2018

(30) Foreign Application Priority Data
Dec. 20, 2016 (JP) .................. 2016-246925

(51) Int. Cl.
| | |
|---|---|
| B08B 5/02 | (2006.01) |
| B05B 1/18 | (2006.01) |
| H01L 21/02 | (2006.01) |
| H01L 21/465 | (2006.01) |
| B05D 1/00 | (2006.01) |
| H01L 21/311 | (2006.01) |
| H01J 37/32 | (2006.01) |
| C23C 16/455 | (2006.01) |
| C23C 16/44 | (2006.01) |

(52) U.S. Cl.
CPC .............. *B08B 5/02* (2013.01); *B05B 1/18* (2013.01); *B05D 1/00* (2013.01); *C23C 16/4405* (2013.01); *C23C 16/45542* (2013.01); *C23C 16/45551* (2013.01); *C23C 16/45565* (2013.01); *H01J 37/32357* (2013.01); *H01L 21/0206* (2013.01); *H01L 21/0228* (2013.01); *H01L 21/02164* (2013.01); *H01L 21/02263* (2013.01); *H01L 21/02274* (2013.01); *H01L 21/31116* (2013.01); *H01L 21/465* (2013.01)

(58) Field of Classification Search
None
See application file for complete search history.

(56) References Cited

U.S. PATENT DOCUMENTS

| | | | | |
|---|---|---|---|---|
| 4,689,112 A | * | 8/1987 | Bersin | H01J 37/32339 156/345.35 |
| 6,500,357 B1 | | 12/2002 | Luo et al. | |
| 7,807,579 B2 | * | 10/2010 | Yang | H01L 21/02063 216/63 |
| 2004/0077511 A1 | * | 4/2004 | Barnes | C11D 11/0041 510/175 |
| 2004/0084412 A1 | * | 5/2004 | Waldfried | G03F 7/427 216/67 |

(Continued)

FOREIGN PATENT DOCUMENTS

| | | |
|---|---|---|
| JP | 2011-517368 | 6/2011 |
| JP | 2012-209394 | 10/2012 |

(Continued)

*Primary Examiner* — Shamim Ahmed
(74) *Attorney, Agent, or Firm* — IPUSA, PLLC

(57) ABSTRACT

A particle removal method is provided for removing particles on a film etched using a fluorine-containing gas. In the method, a mixed gas of an activated oxygen-containing gas and hydrogen gas added to the activated oxygen-containing gas is supplied to the etched film.

13 Claims, 8 Drawing Sheets

(56) References Cited

U.S. PATENT DOCUMENTS

| | | | | |
|---|---|---|---|---|
| 2004/0219789 A1* | 11/2004 | Wood | ............... | C23C 14/022 |
| | | | | 438/690 |
| 2007/0117397 A1* | 5/2007 | Fu | ............... | H01J 37/32357 |
| | | | | 438/710 |
| 2010/0055347 A1* | 3/2010 | Kato | ............... | C23C 16/452 |
| | | | | 427/569 |
| 2011/0226280 A1* | 9/2011 | Berry | ............... | G03F 7/427 |
| | | | | 134/1.1 |
| 2014/0120726 A1 | 5/2014 | Nemani et al. | | |

FOREIGN PATENT DOCUMENTS

| | | |
|---|---|---|
| JP | 2016-162930 | 9/2016 |
| TW | 200305948 | 11/2003 |
| TW | 201419416 | 5/2014 |
| WO | 2009111344 | 9/2009 |

\* cited by examiner

PARTICLE REMOVAL METHOD AND SUBSTRATE PROCESSING METHOD

CROSS-REFERENCE TO RELATED APPLICATIONS

This patent application is based upon and claims priority to Japanese Patent Application No. 2016-246925, filed on Dec. 20, 2016, the entire contents of which are incorporated herein by reference.

BACKGROUND OF THE INVENTION

1. Field of the Invention

The present disclosure relates to a particle removal method and a substrate processing method.

2. Description of the Related Art

Conventionally, as disclosed in Japanese Laid-Open Patent Application Publication No. 2016-162930, a substrate processing apparatus is known that can perform etching while the configuration is based on a turntable type ALD (Atomic Layer Deposition) apparatus. More specifically, the film deposition apparatus disclosed in Japanese Laid-Open Patent Application Publication No. 2016-162930 includes a turntable that is provided in a vacuum chamber and can receive a substrate thereon, a first reaction gas supply part that can supply a first reaction gas to a surface of the turntable, a second reaction gas supply part that can supply a second reaction gas reactable with the first reaction gas to the surface of the turntable and is provided apart from the first reaction gas supply part in a circumferential direction of the turntable, and an activated gas supply part that can supply an activated fluorine-containing gas to the surface of the turntable and is provided apart from the first reaction gas supply part and the second reaction gas supply part in the circumferential direction of the turntable. The activated gas supply part is provided upstream of a gas discharge part, and is configured to include a pipe that can supply the fluorine-containing gas to the gas discharge part, and one or more hydrogen-containing gas supply part that is provided at the pipe and can supply the hydrogen-containing gas into the pipe.

However, it is not necessarily easy to perform film deposition and etching in a single vacuum chamber using the substrate processing apparatus based on the ALD film deposition apparatus. In particular, because the substrate processing apparatus is originally a film deposition apparatus, when performing an etching process, quality of the film after the etching may be insufficient. For example, when performing the etching using the fluorine-containing gas, the fluorine component may remain on the surface of the film, and particles may be generated on the film after being etched, which may roughen the surface of the film after the etching.

SUMMARY OF THE INVENTION

One aspect of the present disclosure provides a particle removal method and a substrate processing method that can reduce particles remaining on a surface of a film after being etched.

According to one embodiment of the present invention, there is provided a particle removal method is provided for removing particles on a film etched using a fluorine-containing gas. In the method, a mixed gas of an activated oxygen-containing gas and hydrogen gas added to the activated oxygen-containing gas is supplied to the etched film.

DESCRIPTION OF THE PREFERRED EMBODIMENTS

Figure 1:
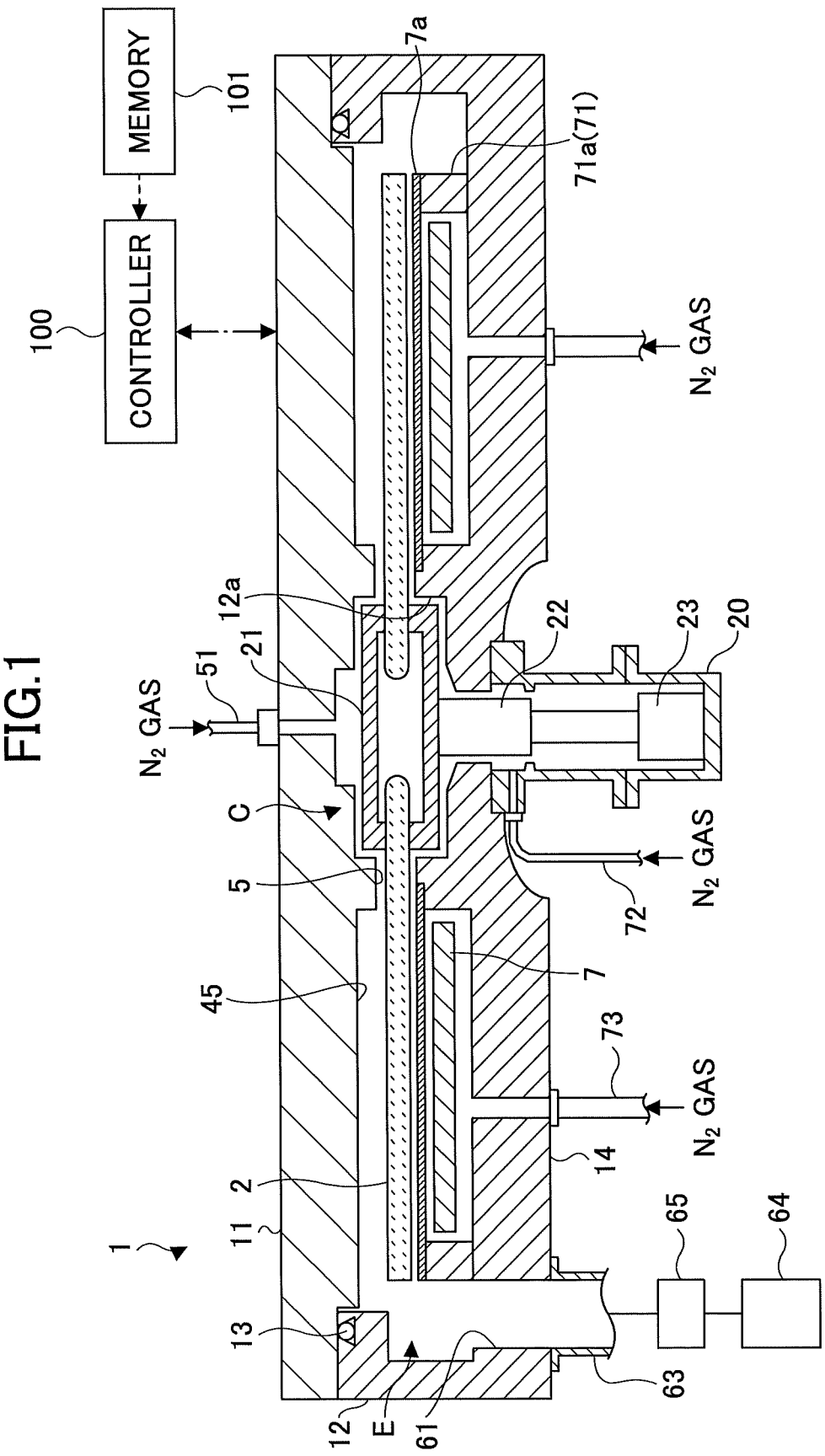
FIG. 1 is a schematic cross-sectional view of a substrate processing apparatus according to an embodiment.

In the following, embodiments of the present invention will be described with reference to the accompanying drawings. Note that in the following descriptions and the accompanying drawings, elements having substantially the same functional features are given the same reference numerals and overlapping descriptions thereof may be omitted.

[Substrate Processing Apparatus Configuration]

Figure 2:
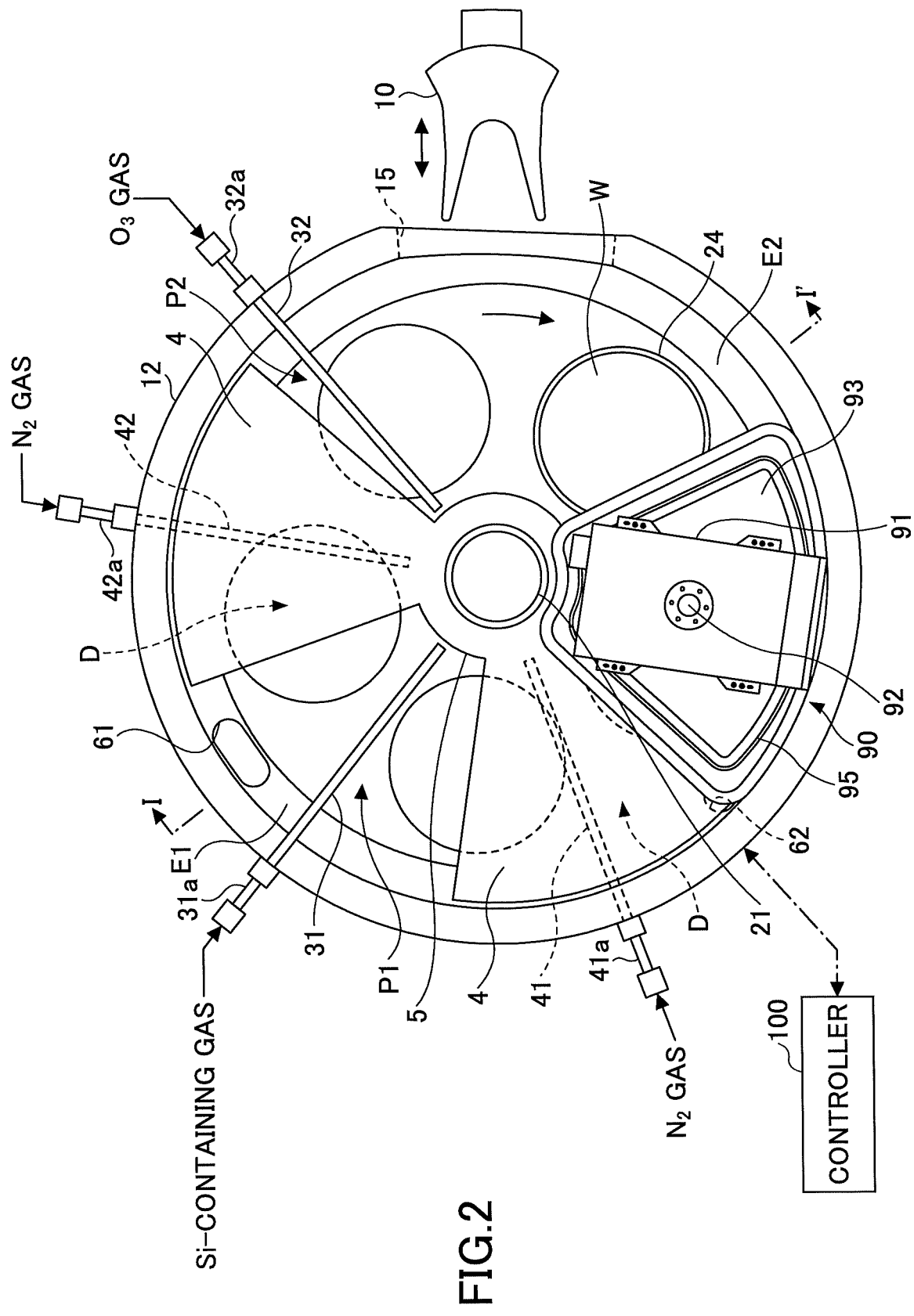
FIG. 2 is a schematic plan view of the substrate processing apparatus.
Figure 3:
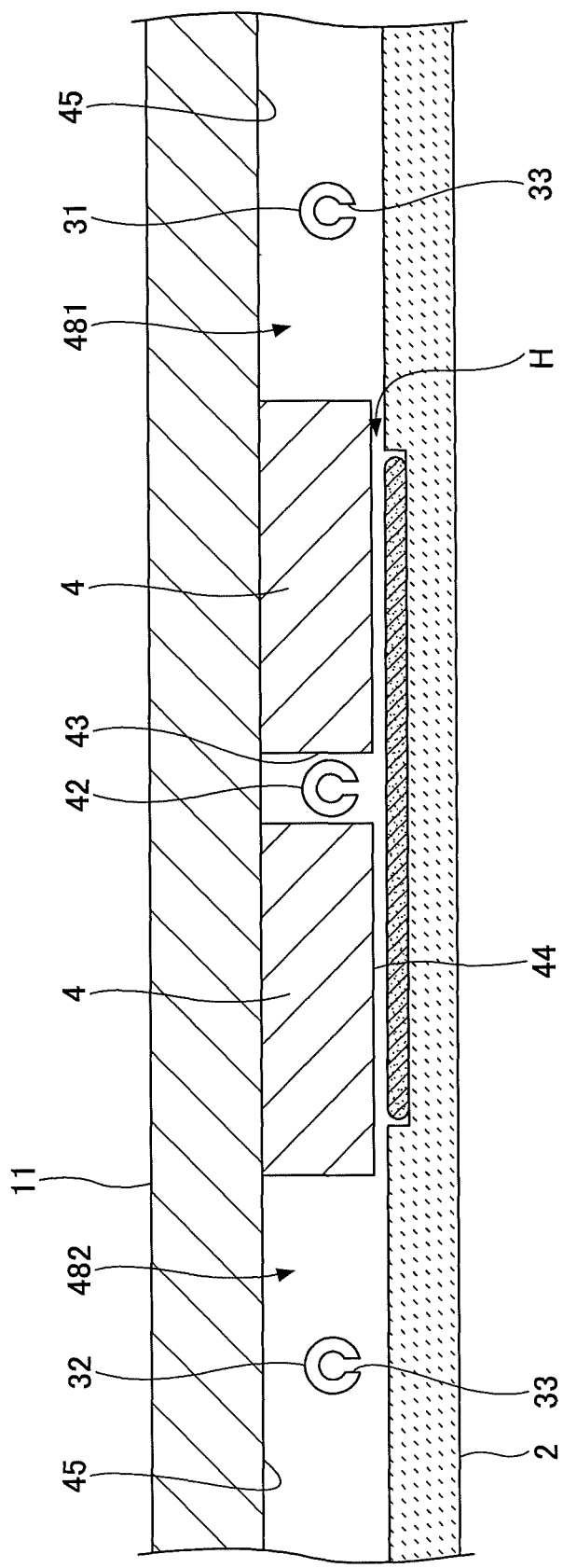
FIG. 3 is a partial cross-sectional view illustrating a separation region in the substrate processing apparatus.
Figure 4:
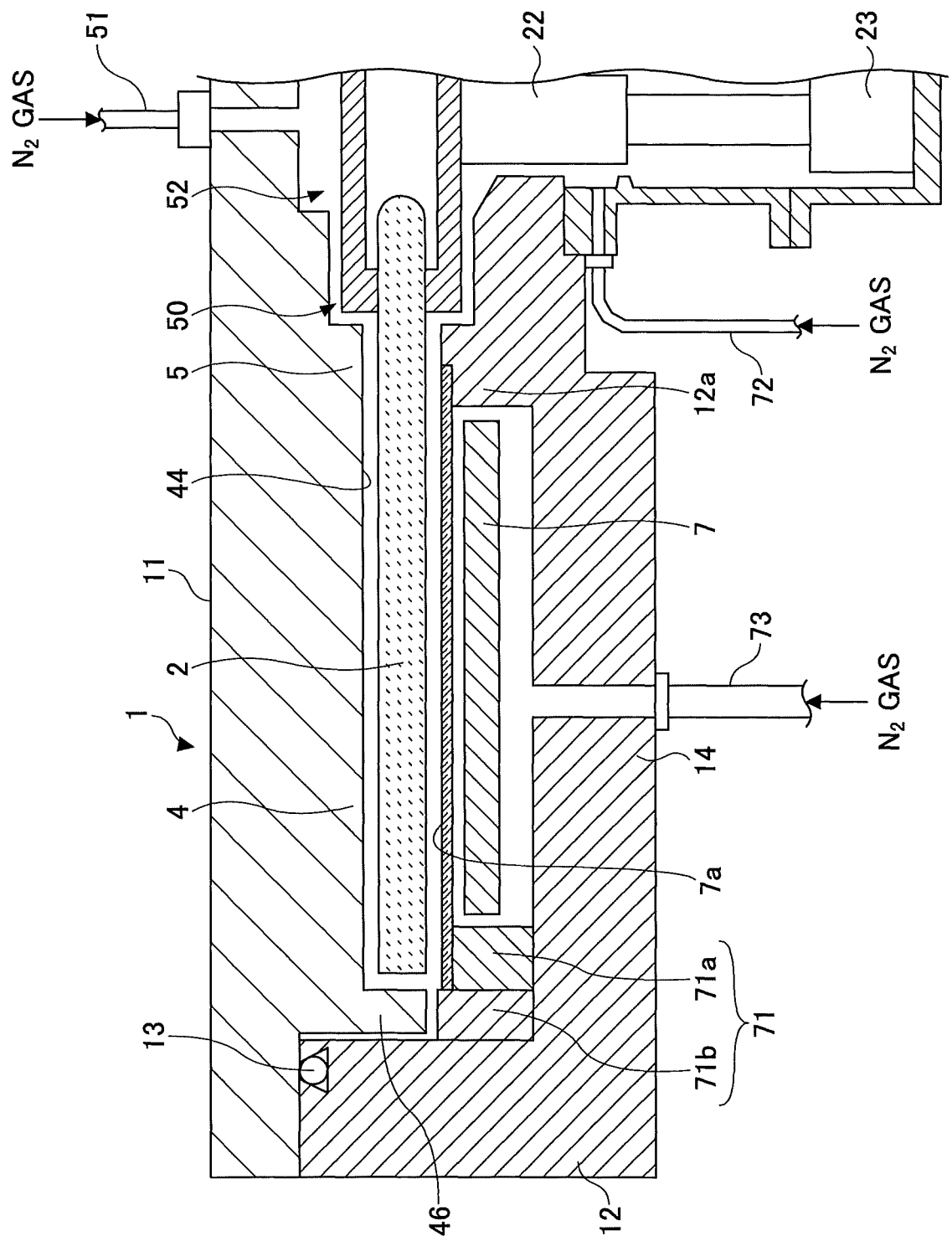
FIG. 4 is another partial cross-sectional view of the substrate processing apparatus.

To begin with, the configuration of a substrate processing apparatus that is preferably used for a particle removal method and a substrate processing method according to an embodiment of the present invention is described below. FIG. 1 is a schematic cross-sectional view of the substrate processing apparatus. FIG. 2 is a schematic plan view of the substrate processing apparatus. FIG. 3 is a partial cross-sectional view illustrating a separation region of the substrate processing apparatus. FIG. 4 is another partial cross-sectional view of the substrate processing apparatus.

As illustrated in FIGS. 1 and 2, the substrate processing apparatus includes a vacuum chamber 1 having a substantially circular planar shape, and a turntable 2 that is arranged within the vacuum chamber 1 such that the center of the vacuum chamber 1 coincides with the rotational center of the turntable 2.

The vacuum chamber 1 includes a chamber body 12 having a cylindrical shape with a bottom, and a ceiling plate 11 that is detachably arranged on an upper surface of the chamber body 12 and is sealed airtight to the upper surface via a sealing member 13 such as an O-ring.

The turntable 2 has a center portion that is fixed to a cylindrical core portion 21. The core portion 21 is fixed to an upper end of a rotary shaft 22 extending in the vertical direction. The rotary shaft 22 penetrates through a bottom portion 14 of the vacuum chamber 1 and has a lower end that is attached to a drive unit 23 for rotating the rotary shaft 22 around a vertical axis. The rotary shaft 22 and the drive unit 23 are accommodated in a cylindrical case 20 having an opening formed at its upper face. The case 20 has a flange portion formed at its upper face that is attached airtight to a bottom surface of the bottom portion 14 of the vacuum chamber 1, and in this way, an internal atmosphere within the case 20 may be maintained airtight from an external atmosphere of the case 20.

As illustrated in FIG. 2, a plurality (e.g., 5 in the illustrated example) of circular concave portions 24 that are capable of accommodating a plurality of semiconductor wafers corresponding to substrates (hereinafter referred to as "wafer W") are arranged along a rotational direction (circumferential direction) on the surface of the turntable 2. Note that in FIG. 2, for convenience, the wafer W is illustrated in only one of the concave portions 24. The concave portion 24 has an inner diameter that is slightly larger (e.g., larger by 4 mm) than the diameter of the wafer W (e.g., 300 mm), and a depth that is approximately equal to the thickness of the wafer W. Thus, when the wafer W is placed in the concave portion 24, the surface of the wafer W and the surface of the turntable 2 (i.e., surface of the region where the wafer W is not placed) may be substantially flush. Also, a number (e.g., 3) of through holes (not illustrated) are formed at a back surface of the concave portion 24 such that lift pins (not illustrated) for supporting the back surface of the wafer W and lifting the wafer W may be arranged to penetrate through the through holes.

Also, as illustrated in FIG. 2, reaction gas nozzles 31 and 32, separation gas nozzles 41 and 42, and an activated gas supply unit 90 are arranged above the turntable 2. In the illustrated example, the activated gas supply unit 90, the separation gas nozzle 41, the reaction gas nozzle 31, the separation gas nozzle 42, and the reaction gas nozzle 32 are spaced apart along the circumferential direction of the vacuum chamber 1 in the recited order as viewed clockwise (rotational direction of the turntable 2) from a transfer port 15 (described below). Note that the reaction gas nozzle 31 is an example of a first reaction gas supply unit, and the reaction gas nozzle 32 is an example of a second reaction gas supply unit.

The reaction gas nozzles 31 and 32 respectively include gas introduction ports 31*a* and 32*a* corresponding to base portions that are fixed to an outer peripheral wall of the chamber body 12. The reaction gas nozzles 31 and 32 are introduced into the vacuum chamber 1 from the outer peripheral wall of the vacuum chamber 1. Also, the reaction gas nozzles 31 and 32 are arranged to extend parallel with respect to the rotating table 2 along the radial directions of the chamber body 12.

The separation gas nozzles 41 and 42 respectively include gas introduction ports 41*a* and 42*a* corresponding to base portions that are fixed to the outer peripheral wall of the chamber body 12. The separation gas nozzles 41 and 42 are introduced into the vacuum chamber 1 from the outer peripheral wall of the vacuum chamber 1. The separation gas nozzles 41 and 42 are arranged to extend parallel with respect to the turntable 2 along the radial directions of the chamber body 12.

Note that the activated gas supply unit 90 is described later.

The reaction gas nozzle 31 may be made of quartz, for example, and is connected to a supply source of a Si (silicon)-containing gas that is used as a first reaction gas via a pipe and a flow controller (not illustrated), for example. The reaction gas nozzle 32 may be made of quartz, for example, and is connected to a supply source of an oxidizing gas that is used as a second reaction gas via a pipe and a flow controller (not illustrated), for example. The separation gas nozzles 41 and 42 are each connected to supply sources of separation gases via a pipe and a flow control valve (not illustrated), for example.

Note that organic amino silane gas may be used as the Si-containing gas, and $O_3$ (ozone) gas or $O_2$ (oxygen) gas may be used as the oxidizing gas, for example. Also, $N_2$ (nitrogen) gas and Ar (argon) gas may be used as the separation gases, for example.

The reaction gas nozzles 31 and 32 have a plurality of gas discharge holes 33 that open toward the turntable 2 (see FIG. 3). The gas discharge holes 33 may be arranged at intervals of 10 mm, for example, along the length direction of the reaction gas nozzles 31 and 32, for example. A lower region of the reaction gas nozzle 31 corresponds to a first process region P1 for causing adsorption of the Si-containing gas on the wafer W. A lower region of the reaction gas nozzle 32 corresponds to a second process region P2 for oxidizing the Si-containing gas that has been adsorbed on the wafer W at the first process region P1.

Referring to FIG. 2, convex portions 4 protruding toward the turntable 2 from back surface regions of the ceiling plate 11 near the separation gas nozzles 41 and 42 are provided in the vacuum chamber 1. The convex portions 4 and the separation gas nozzles 41 and 42 form separation regions D. The convex portion 4 is fan-shaped in planar view and has a top portion that is cut into a circular arc shape. In the present embodiment, the inner arc of the convex portion 4 is connected to a protruding portion 5 (described below) and the outer arc of the convex portion 4 is arranged along an inner peripheral surface of the chamber body 12 of the vacuum chamber 1.

FIG. 3 is a partial cross-sectional view of the vacuum chamber 1 along a concentric circle of the turntable 2 from the reaction gas nozzle 31 to the reaction gas nozzle 32. As illustrated in FIG. 3, the vacuum chamber 1 includes a first ceiling surface 44 corresponding to the back surface of the convex portion 4 that is low and flat, and a second ceiling surface 45 that is higher than the first ceiling surface 44 and is arranged at both sides of the first ceiling surface 44 in the circumferential direction.

The first ceiling surface 44 is fan-shaped in planar view and has a top portion that is cut into a circular arc shape. Also, as illustrated in FIG. 3, a groove portion 43 extending in a radial direction is formed at the center in the circumferential direction of the convex portion 4, and the separation gas nozzle 42 is accommodated within this groove portion 43. Note that another groove portion 43 is similarly formed in the other convex portion 4, and the separation gas nozzle 41 is accommodated within this groove portion 43. Also, the reaction gas nozzles 31 and 32 are arranged in spaces below the higher second ceiling surface 45. The reaction gas nozzles 31 and 32 are spaced apart from the second ceiling surface 45 to be arranged close to the wafer W. As illustrated in FIG. 3, the reaction gas nozzle 31 is provided in the right-side space below the higher second ceiling surface 45, and the reaction gas nozzle 32 is provided in the left-side space below the higher second ceiling surface 45.

The first ceiling surface 44 forms a separation space H corresponding to a narrow space between the first ceiling surface 44 and the surface of the turntable 2. The separation space H can separate the Si-containing gas supplied from the first region P1 and the oxidizing gas supplied from the second region P2 from each other. Specifically, when $N_2$ gas is discharged from the separation gas nozzle 42, $N_2$ gas discharged from the separation gas nozzle 42 flows toward the space 481 and the space 482 through the separation space H. At this time, because $N_2$ gas flows through the narrow separation space H that has a smaller volume than that of the spaces 481 and 482, the pressure in the separation space H can be made higher than the pressure in the spaces 481 and 482. That is, a pressure barrier may be created between the spaces 481 and 482. Also, $N_2$ gas flowing from the separation space H into the spaces 481 and 482 acts as counter-flows against the flow of the Si-containing gas from the first area P1 and the flow of the oxidizing gas from the second region P2. Thus, the Si-containing gas and the oxidizing gas may be substantially prevented from flowing into the separation space H. In this way, the Si-containing gas and the oxidizing gas are prevented from mixing and reacting with each other in the vacuum chamber 1.

Referring to FIG. 2, the protruding portion 5 is provided around the outer periphery of the core portion 21 that supports the turntable 2, and the protruding portion 5 is arranged on the lower surface of the ceiling plate 11. In the present embodiment, the protruding portion 5 is connected to a rotational center side portion of the convex portion 4, and a bottom surface of the protruding portion 5 is arranged to be flush with the first ceiling surface 44.

Note that for convenience of explanation, FIG. 2 illustrates a cross-section of the chamber body 12 cut along a position that is higher than the second ceiling surface 45 and lower than the separation gas nozzles 41 and 42.

FIG. 1 referred to above is a cross-sectional view of the substrate processing apparatus along line I-I' of FIG. 2 illustrating a region where the second ceiling surface 45 is arranged. On the other hand, FIG. 4 is a partial cross-sectional view of the substrate processing apparatus illustrating a region where the first ceiling surface 44 is arranged.

As illustrated in FIG. 4, a bent portion 46 that is bent into an L-shape to face an outer edge face of the turntable 2 is formed at a peripheral portion (portion toward the outer edge of the vacuum chamber 1) of the fan-shaped convex portion 4. The bent portion 46, like the convex portion 4, prevents the two reaction gases from entering the separation space H from both sides of the separation area D and prevents the two reaction gases from mixing with each other. The fan-shaped convex portion 4 is provided on the ceiling plate 11, and the ceiling plate 11 is provided to be detachable from the chamber body 12. Thus, a slight gap is formed between an outer peripheral face of the bent portion 46 and the chamber body 12. Note that dimensions of a gap between an inner peripheral face of the bent portion 46 and an outer edge face of the turntable 2, and the gap between the outer peripheral face of the bent portion 46 and the chamber body 12 may be substantially the same as the height dimension of the first ceiling surface 44 with respect to the surface of the turntable 2, for example.

In the separation region D, an inner peripheral wall of the chamber body 12 is arranged into a substantially vertical plane that is in close proximity with the outer peripheral face of the bent portion 46 as illustrated in FIG. 3. Note, however, that in regions other than the separation region D, the inner peripheral wall of the chamber body 12 may have a portion recessed outward from a region facing the outer edge face of the turntable 12 to the bottom portion 14 as illustrated in FIG. 1, for example. In the following, for convenience of explanation, such a recessed portion having a rectangular cross section is referred to as "exhaust region E". More specifically, the exhaust region E that communicates with the first process region P1 is referred to as "first exhaust region E1", and the exhaust region E that communicates with the second process region P2 is referred to as "second exhaust region E2" as illustrated in FIG. 2. Further, a first exhaust port 61 and a second exhaust port 62 are respectively formed at the bottom of the first exhaust region E1 and the second exhaust region E2. As illustrated in FIG. 1, the first exhaust port 61 and the second exhaust port 62 are each connected to a vacuum exhaust unit such as a vacuum pump 64 via an exhaust pipe 63. Also, a pressure regulating unit 65 is provided at the exhaust pipe 63.

As illustrated in FIGS. 1 and 4, a heater unit 7 as a heating unit may be arranged in a space between the turntable 2 and the bottom portion 14 of the vacuum chamber 1, and a wafer W arranged on the turntable 2 may be heated to a predetermined temperature according to a process recipe via the turntable 2. Also, a ring-shaped cover member 71 for preventing gas from entering a region below the turntable 2 is arranged at a lower side of a peripheral edge portion of the turntable 2. The cover member 71 acts as a partition member for separating the atmosphere of a region extending from the space above the turntable 2 to the exhaust regions E1 and E2 from the atmosphere of a space where the heater unit 7 is arranged.

The cover member 71 includes an inner member 71a that is arranged under an outer edge portion of the turntable 2 and a portion extending further outward from this outer edge portion, and an outer member 71b that is arranged between the inner member 71a and an inner wall face of the vacuum chamber 1. In the separation region D, the outer member 71b is arranged near the bent portion 46, at the lower side of the bent portion 46, which is formed at the outer edge portion of the convex portion 4. The inner member 71a is arranged to surround the entire periphery of the heater unit 7 below the outer edge portion of the turntable 2 (and the portion extending slightly outward from the outer edge portion).

A protrusion 12a is formed at a part of the bottom portion 14 toward the rotational center of the space where the heater unit 7 is disposed. The protrusion 12a protrudes upward to approach the core portion 21 at a center portion of the bottom surface of the turntable 2. A narrow space is formed between the protrusion 12a and the core portion 21. Also, a narrow space is provided between an outer peripheral face of the rotary shaft 22 that penetrates through the bottom portion 14 and the inner peripheral face of a through hole for the rotary shaft 22. Such narrow spaces are arranged to be in communication with the case 20. Further, a purge gas supply pipe 72 for supplying $N_2$ gas as a purge gas is provided at the case 20.

Also, a plurality of purge gas supply pipes 73 for purging the space accommodating the heater unit 7 are arranged at the bottom portion 14 of the vacuum chamber 1 at intervals of a predetermined angle along the circumferential direction below the heater unit 7 (only one of the purge gas supply pipes 73 is illustrated in FIG. 4). Also, a lid member 7a is arranged between the heater unit 7 and the rotating table 2 in order to prevent gas from entering the region where the heater unit 7 is located. The lid member 7a is arranged to extend in the circumferential direction to cover a region between an inner wall of the outer member 71b (upper face of the inner member 71a) and an upper edge portion of the protrusion 12a. The lid member 7a may be made of quartz, for example.

Also, a separation gas supply pipe 51 is connected to a center portion of the ceiling plate 11 of the vacuum chamber 1. The separation gas supply pipe 51 is configured to supply $N_2$ gas as a separation gas to a space 52 between the ceiling plate 11 and the core portion 21. The separation gas supplied to the space 52 is discharged toward the periphery of the turntable 2 along a wafer receiving region side surface of the turntable 2 via a narrow space 50 between the protruding portion 5 and the turntable 2. The pressure within the space 50 can be maintained at a higher pressure than the pressure within the space 481 and the space 482 by the separation gas. That is, by providing the space 50, the Si-containing gas supplied to the first process region P1 and the oxidizing gas supplied to the second process region P2 may be prevented from passing through a center region C (see FIG. 1) to mix with each other. In other words, the space 50 (or the center region C) may have a function similar to that of the separation space H (or separation region D).

Further, as illustrated in FIG. 2, the transfer port 15 for transferring the wafer W corresponding to a substrate between an external transfer arm 10 and the turntable 2 is arranged at a side wall of the vacuum chamber 1. The transfer port 15 may be opened/closed by a gate valve (not illustrated). Note that the wafer W may be transferred back and forth between the concave portion 24 corresponding to the wafer receiving region of the turntable 2 and the transfer arm 10 when the concave portion 24 is positioned to face the transfer port 15. Accordingly, lift pins that penetrate through the concave portion 24 to lift the wafer W from its back surface and a lift mechanism for the lift pins (not illustrated) are arranged at a portion below the turntable 2 corresponding to a transfer position for transferring the wafer W.

Figure 5:
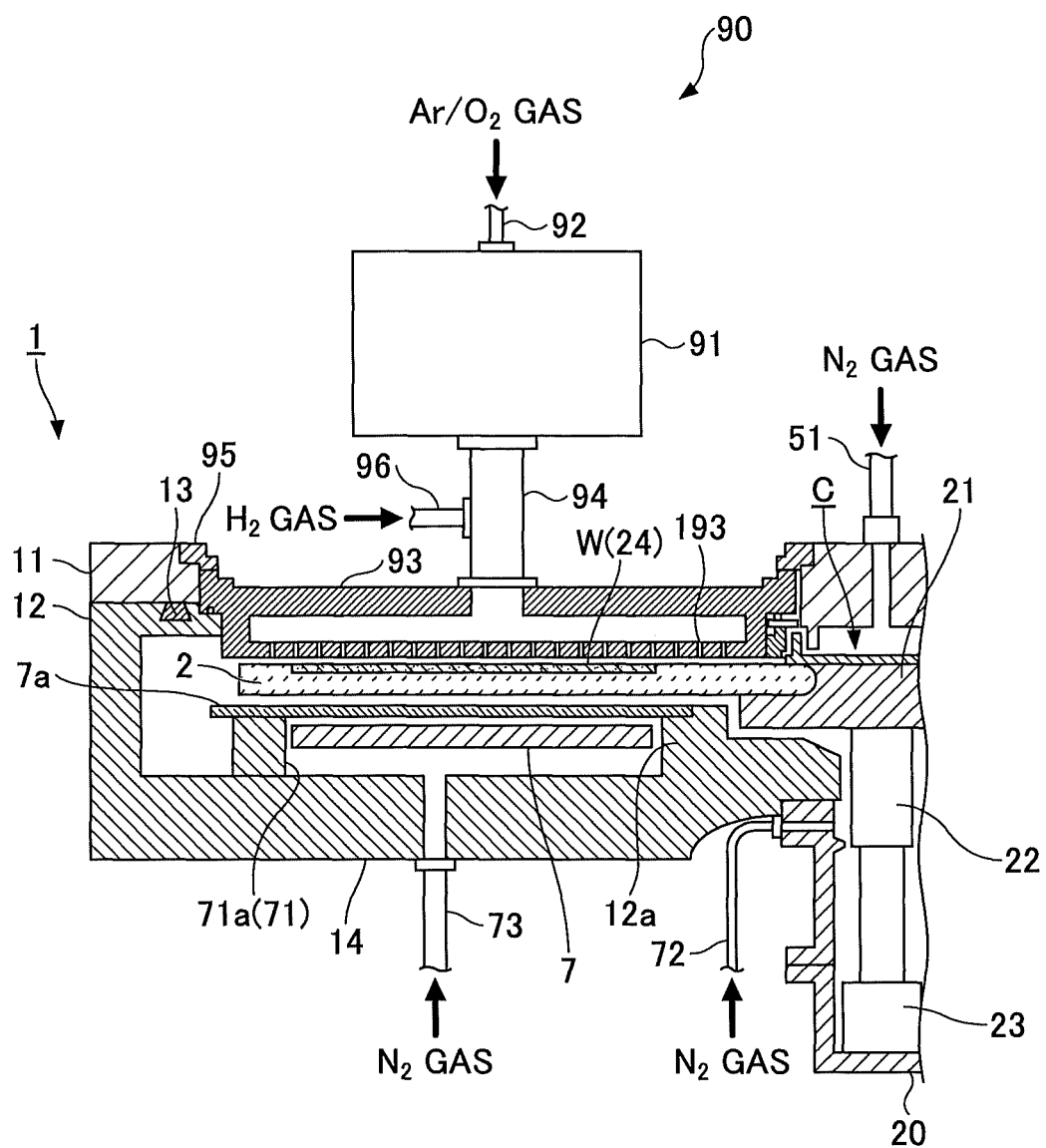
FIG. 5 is a partial cross-sectional view illustrating a third process region of the substrate processing apparatus.
Figure 6:
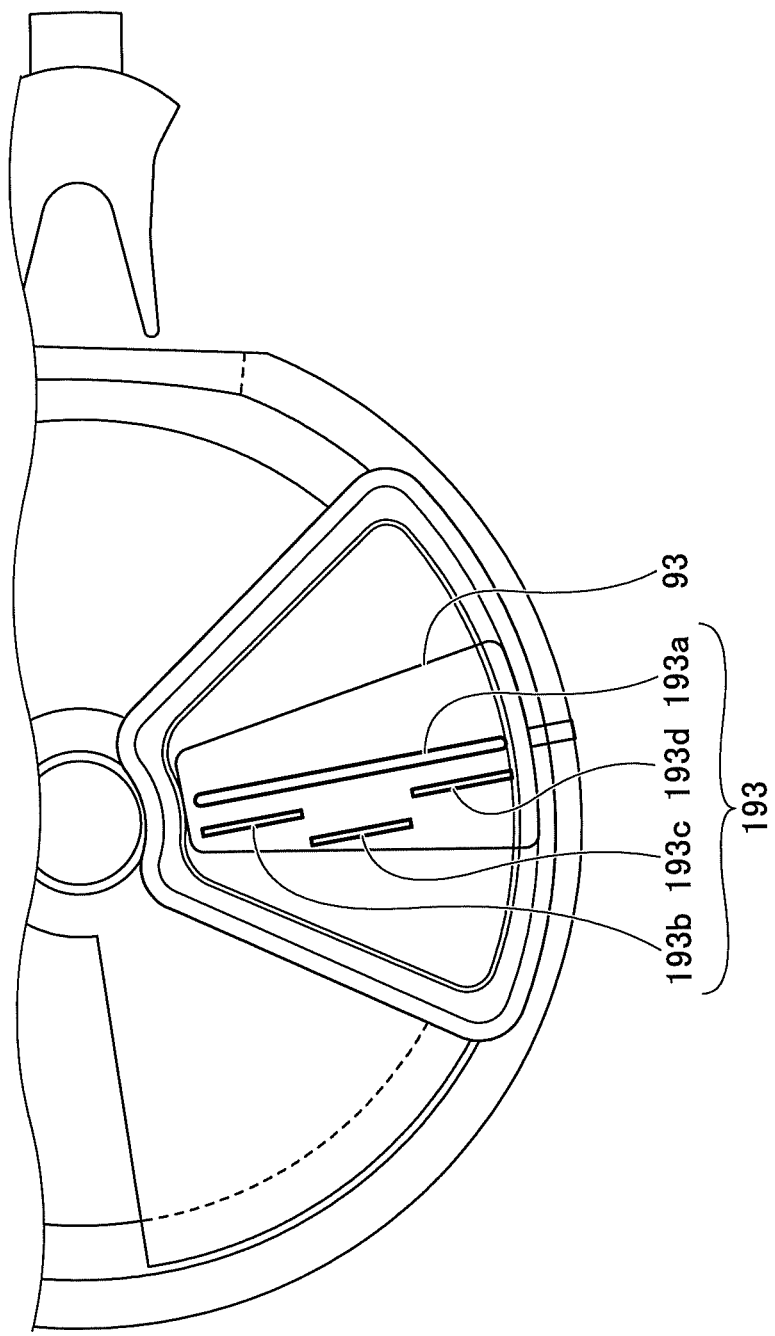
FIG. 6 is a diagram illustrating an example of an arrangement of gas discharge holes provided in a bottom surface of a showerhead of the substrate processing apparatus.
Figure 7:
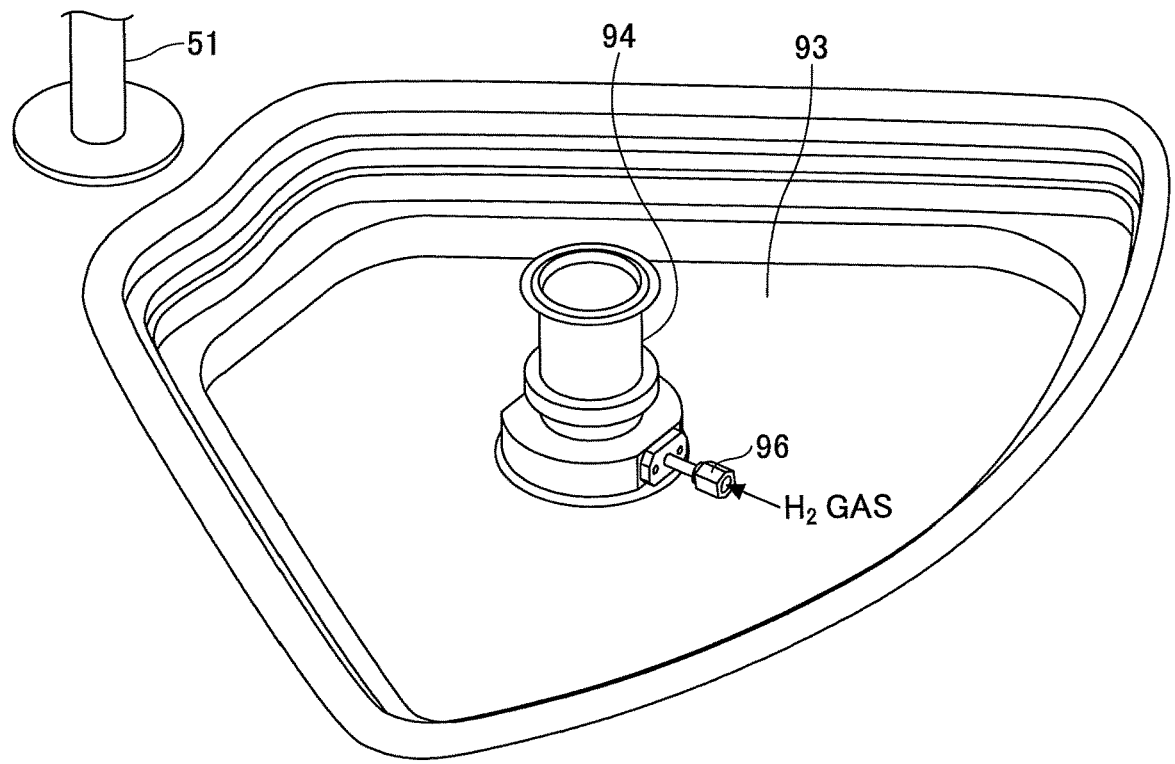
FIG. 7 is schematic perspective view illustrating a first form of a hydrogen gas supply part of the substrate processing apparatus.
Figure 8:
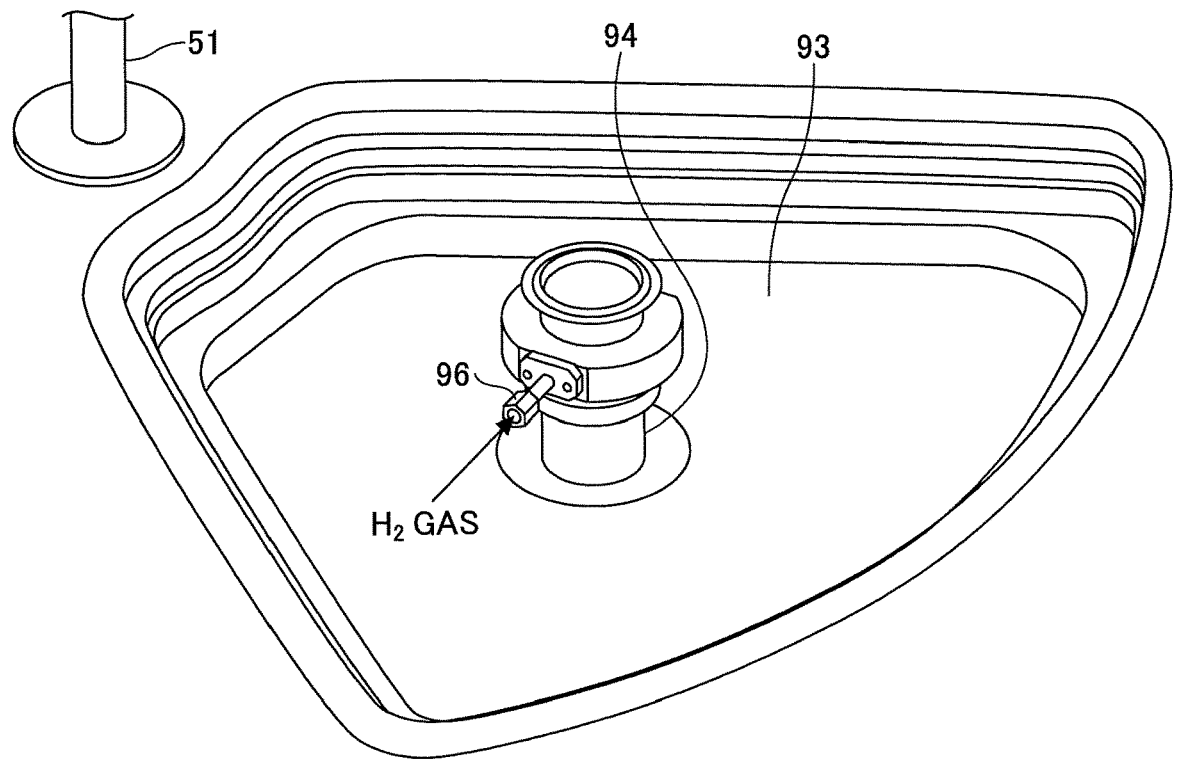
FIG. 8 is schematic perspective view illustrating a first form of a hydrogen gas supply part of the substrate processing apparatus.

Next, the activated gas supply unit 90 is described below with reference to FIGS. 2 and 5-8. FIG. 5 is a partial cross-sectional view illustrating a third process region P3 of the substrate processing apparatus. FIG. 6 is a diagram for explaining an example of an arrangement of gas discharge holes of a showerhead unit. FIGS. 7 and 8 are schematic perspective views illustrating a hydrogen-containing gas supply part 96 of the substrate processing apparatus.

The activated gas supply unit 90 supplies an activated fluorine-containing gas to a film formed on the wafer W to etch the film. As illustrated in FIGS. 2 and 5, the activated gas supply unit 90 includes a plasma generation chamber 91, an etching gas supply pipe 92, a showerhead part 93, a pipe 94, and a hydrogen-containing gas supply part 96. Note that the showerhead part 93 is an example of a discharge part.

The plasma generation chamber 91 activates a fluorine-containing gas supplied from the etching gas supply pipe 92 using a plasma source. The plasma source is not particularly limited as long as it is capable of activating the fluorine-containing gas to generate F (fluorine) radicals. For example, an inductively coupled plasma (ICP), a capacitively coupled plasma (CCP), or a surface wave plasma (SWP) may be used as the plasma source.

The etching gas supply pipe 92 has one end that is connected to the plasma generation chamber 91 and is configured to supply the fluorine-containing gas to the plasma generation chamber 91. In the particle removal method according to the present embodiment, an oxygen-containing gas such as Ar/$O_2$ is supplied from the gas supply pipe 92. The other end of the gas supply pipe 92 is connected to an oxygen-containing gas supply source that stores the oxygen-containing gas, for example, via an switching valve and a flow controller. A gas that contains $O_2$, $O_3$, $H_2O$ and the like can be used as the oxygen-containing gas, but $O_2$ gas is preferably used in terms of generating plasma in the plasma generation chamber 91, and an mixed gas of Ar/$O_2$ that contains Ar is further preferably used in terms of readily generating plasma. However, a type of the oxygen-containing gas is not limited to a specific gas type as long as the oxygen plasma can be generated in the plasma generation chamber 91.

The substrate processing apparatus can not only remove particles on a film after etching but also perform the previous etching process in the vacuum chamber 1. Thus, etching the film and removing the particles on the etched film can be sequentially performed in the vacuum chamber 1. In such a case, the activated gas supply unit 90 supplies an activated etching gas to the wafer W in the etching process. In this case, the gas supplied from the gas supply pipe 92 to the plasma generation chamber 91 is selected from gases that can etch the film deposited on the wafer W. More specifically, for example, fluorine-containing gases and the like that can etch a silicon oxide film including hydrofluorocarbons such as $CHF_3$ (trifluoromethane), fluorocarbons such as $CF_4$ (carbon tetrafluoride) and $C_3F_8$ (Octafluoropropane), and further HF, $F_2$ and the like can be used as the etching gas. Further, gases such as Ar gas and/or $O_2$ gas may be added to these fluorine-containing gases at appropriate amounts, for example.

The showerhead part 93 is connected to the plasma generation chamber 91 through the pipe 94, and serves as a unit to supply a gas such as an oxygen-containing gas activated in the plasma generation chamber 91. Hence, although the plasma generation chamber 91 is provided outside the vacuum chamber 1, the showerhead part 93 is provided to be able to supply the activated gas into the vacuum chamber 1. More specifically, the showerhead part 93 is fan-shaped in planar view and is pressed downward along the circumferential direction by a press member 95 that is formed along the outer edge of the fan shape. The press member 95 is fixed to the ceiling plate 11 by a bolt or the like (not illustrated), and in this way, the internal atmosphere of the vacuum chamber 1 may be maintained airtight. The distance between a lower surface of the showerhead part 93 when it is secured to the ceiling plate 11 and an upper surface of the turntable 2 may be arranged to be about 0.5 mm to about 5 mm, for example. For example, when an etching process is performed in the substrate processing apparatus, a region under the showerhead part 93 corresponds to the third process region P3 for removing particles on an etched film. In this way, the activated gas supplied into the vacuum chamber 1 through the showerhead part 93 is efficiently supplied to the surface of the wafer W.

A plurality of gas discharge holes 193 are arranged at the showerhead part 93. In view of the difference in angular velocity of the turntable 2, a smaller number of the gas discharge holes 193 are arranged at a rotational center side of the showerhead part 93, and a larger number of the gas discharge holes 193 are arranged at an outer periphery side of the showerhead part 93. The total number of the gas discharge holes 193 may be several tens to several hundreds, for example. Also, the diameter of the plurality of gas discharge holes 193 may be about 0.5 mm to about 3 mm, for example. The gas such as the activated oxygen-containing gas supplied to the showerhead part 93 may be supplied to the space between the turntable 2 and the showerhead part 93 through the gas discharge holes 193. Thus, the showerhead part 93 is formed as a gas discharge unit capable of supplying the activated gas into the vacuum chamber 1.

FIG. 6 is a diagram illustrating an example of an arrangement of the gas discharge holes 193 provided in the bottom surface of the showerhead part 93. The gas discharge holes 193 just have to supply the activated gas to the entire region of the wafer W, and the configuration is not limited to a specific configuration as long as the gas discharge holes 193 have a shape and an arrangement that can cover the whole area of the concave portion 24 in the radial direction of the turntable 2. For example, the gas discharge holes 193 may be configured as illustrated in FIG. 6. In FIG. 6, the gas discharge holes 193 include a gas discharge hole 193a that extends throughout the radius of the turntable 2 in the radial direction, that is, from the central axis side to the peripheral side of the turntable 2. The gas discharge holes 193 also include gas discharge holes 193b, 193c and 193d that can regionally supply a gas to the axial side region, the middle region, and the peripheral region, respectively. Thus, the gas discharge holes 193 may be configured to include the gas discharge holes 193b, 193c and 193d that can supply the gas to the axial side region, the middle region, and the peripheral region of the concave portion 24, respectively, in addition to the gas discharge holes 193a that can supply the activated gas to the entire region of the concave portion 24. On the other hand, only the gas discharge hole 193a may be provided. Moreover, in the configuration illustrated in FIG. 6, all of the gas discharge holes 193a through 193d may be connected to the plasma generation chamber 91. Otherwise, only the gas discharge hole 193a may be connected to the plasma generation chamber 91, and the supplemental gas discharge holes 193b through 193d may be formed as independent lines without being connected to the plasma generation chamber 91 to be able to supply inactivated gases. Thus, the gas discharge holes 913 may be formed into a variety of structures.

The pipe 94 is arranged upstream of the showerhead part 93 and connects the plasma generation chamber 91 and the showerhead part 93. The hydrogen-containing gas supply unit 96 is arranged at an outer peripheral side of the pipe 94 with respect to the radial direction of the turntable 2.

The hydrogen-containing gas supply unit 96 has one end that is connected to the pipe 94 and is configured to supply a hydrogen-containing gas into the pipe 94. The other end of the hydrogen-containing gas supply unit 96 is connected to a hydrogen-containing gas supply source via a switching valve and a flow controller, for example.

Moreover, the hydrogen gas supply part 96 is preferably provided at a location closer to the showerhead part 93 than the plasma generation chamber 91. This can prevent hydrogen gas to be supplied into the pipe 94 through the hydrogen gas supply part 96 from flowing backward to the plasma generation chamber 91. As a result, contamination caused by the metal constituting the plasma generation chamber 91 can be inhibited, and a lifetime of parts constituting the plasma generation chamber 91 can be prolonged.

When a particle removal process for removing particles is performed on an already etched film, hydrogen gas just has to be added activated oxygen gas alone, and the mixed gas of activated oxygen gas and added hydrogen gas just has to be supplied to a surface of the film formed on the wafer W by supplying hydrogen gas into the pipe 94 through the hydrogen gas supply part 96. In contrast, when an etching process is also performed in the substrate processing apparatus, no gas may be supplied to the hydrogen gas supply part 96, or the mixed gas of hydrogen and Ar may be supplied to the hydrogen gas supply part 96.

When performing the etching, a fluorine-containing gas for etching after being activated in the plasma generation chamber 91 is supplied to the film on the wafer W, in general, but there is a processing method of performing the etching process while supplying a hydrogen-containing gas from the hydrogen gas supply part 96.

In this case, a mixed gas of $H_2$ (hydrogen) gas and Ar gas (which is hereinafter referred to as "$H_2$/Ar gas") can be used as the hydrogen-containing gas, for example. Moreover, a flow rate of $H_2$ gas may be set in a range of 1 sccm to 50 sccm, and a flow rate of Ar gas may be set in a range of 500 sccm to 10 slim, for example. In this case, the hydrogen gas supply part 96 serves as a hydrogen-containing gas supply part 96 accurately. Thus, the hydrogen gas supply part 96 may be referred to as the hydrogen-containing gas supply part 96 when supplying a hydrogen-containing gas.

In the example of FIGS. 5 and 7, the single hydrogen gas supply part 96 is provided on the peripheral side of the pipe 94 in the radial direction of the turntable 2, but the embodiments are not limited to such an arrangement. For example, as illustrated in FIG. 8, the hydrogen gas supply part 96 may be provided on the front side or the rear side of the pipe 94 in the rotational direction of the turntable 2. Also, in some examples, a plurality of the hydrogen-containing gas supply units 96 may arranged at the pipe 94.

Further, the substrate processing apparatus includes a controller 100 configured by a computer for performing control operations of the substrate processing apparatus. The controller 100 includes a memory storing a program for causing the substrate processing apparatus to implement substrate processing method according to an embodiment of the present invention under control of the controller 100 as described below. The program includes a set of steps for implementing operations of the substrate processing apparatus as described below and may be installed in the controller 100 from a storage unit 100 that may be configured by a hard disk, a compact disk, a magnetic optical disk, a memory card, a flexible disk, or some other type of computer-readable storage medium.

[Particle Removal Method and Substrate Processing Method)

An example of particle removal method and a substrate processing method using the above-described substrate processing apparatus according to an embodiment is described below. Although the particle removal method and the substrate processing method according to the embodiments can be applied to the substrate processing apparatuses having various structures as long as the substrate processing apparatus is configured to be able to supply an activated gas to a surface of a film formed on a substrate, an example of using the above-mentioned substrate processing apparatus is described below for convenience of explanation in the present embodiment.

Here, the above-mentioned substrate processing apparatus is configured based on an ALD apparatus, and is configured to be able to perform all of the film deposition process, the etching process, and the particle removal process within the vacuum chamber 1. Hence, a series of processes including all of the processes of depositing a film on a substrate, etching the deposited film, and removing particles on the etched film, is described in the following embodiments.

Note that an example of a method of forming a $SiO_2$ film in a via hole corresponding to a recessed pattern that is formed in the wafer W is described below. Also, note that in the example described below, it is assumed that a Si-containing gas is used as the first reaction gas, and that an oxidizing gas is used as the second reaction gas in the film deposition process. Similarly, note that in the example described below, it is assumed that a mixed gas of $CF_4$, Ar gas, and $O_2$ gas (hereinafter referred to as "$CF_4$/Ar/$O_2$ gas") is used as the fluorine-containing gas in the etching process, and that a mixed gas of Ar gas and $O_2$ gas (hereinafter referred to as "Ar/$O_2$ gas") is used as the oxygen-containing gas in the particle removal process.

First, a gate valve (not illustrated) is opened, and a wafer W is transferred from the exterior by the transfer arm 10 via the transfer port 15 to be placed within one of the concave portions 24 of the turntable 2 as illustrated in FIG. 2. The transfer of the wafer W may be accomplished by lifting the lift pins (not illustrated) from the bottom side of the vacuum chamber 1 via the through holes that are formed in the back surface of the concave portion 24 when the concave portion 24 comes to a halt at a position facing the transfer port 15. Such a transfer of the wafer W may be performed with respect to each of the five concave portions 24 of the turntable 2 by intermittently rotating the turntable 2 to place a wafer W in each of the concave portions 24, for example.

Then, the gate valve is closed, and the vacuum pump 64 evacuates the vacuum chamber 1. Then, $N_2$ gas as a separation gas is discharged at a predetermined flow rate from the separation gas nozzles 41 and 42, and $N_2$ gas is discharged at a predetermined flow rate from the separation gas supply pipe 51 and the purge gas supply pipes 72 and 73. In turn, the pressure regulating unit 65 adjusts the pressure within the vacuum chamber 1 to a preset processing pressure. Then, the heater unit 7 heats the wafers W up to 450° C., for example, while the turntable 2 is rotated clockwise at a rotational speed of 60 rpm, for example.

Then, a film deposition process is performed. In the film deposition process, a Si-containing gas is supplied from the reaction gas nozzle 31, and an oxidizing gas is supplied from the reaction gas nozzle 32. For example, $O_3$ gas may be used as the oxidizing gas. Note that in this process, no gas or an activated oxidizing gas is supplied from the activated gas supply unit 90. For example, $O_2$ gas or $Ar/O_2$ gas may be used as the activated oxidizing gas. The activated oxidizing gas supplied form the activated gas supply unit 90 is a treatment gas to modify a $SiO_2$ film that is a reactive product of the Si-containing gas and the oxidizing gas.

When one of the wafers W passes the first process region P1, the Si-containing gas as a source gas that is supplied from the reaction gas nozzle 31 is adsorbed on the surface of the wafer W. Then, as the turntable 2 is rotated, the wafer W having the Si-containing gas adsorbed on its surface passes the separation region D including the separation gas nozzle 42 where the wafer W is purged. Thereafter, the wafer W enters the second process region P2. In the second process region P2, the oxidizing gas is supplied from the reaction gas nozzle 32, and Si components contained in the Si-containing gas is oxidized by the oxidizing gas. As a result, $SiO_2$ corresponding to a reaction product of the oxidization is deposited on the surface of the wafer W. Next, the wafer W having the $SiO_2$ film deposited on its surface enters the third process region P3. In the third process region P3, activated oxygen is supplied from the gas discharge holes 193 to the wafer W, and activated oxygen reacts with unreacted Si components, thereby further producing a $SiO_2$ film. By doing such a treatment process, the deposited $SiO_2$ film is made dense, and is enhanced. When the activated gas supply unit 90 doses not supply any gas, the treatment process is omitted. Because the treatment process is an optional process performed to increase the density of the produced film and enhance the quality of the film, the treatment process can be omitted depending on the intended use.

The wafer W that has passed the second process region P2 passes the separation region D including the separation gas nozzle 41 where the wafer W is purged. Then, the wafer W enters the first process region P1 once again. Then, the Si-containing gas that is supplied from the reaction gas nozzle 31 is adsorbed on the surface of the wafer W.

As described above, in the film deposition process, the turntable 2 is consecutively rotated a plurality of times while supplying the first reaction gas and the second reaction gas into the vacuum chamber 1 but without supplying a fluorine-containing gas into the vacuum chamber 1. In this way, $SiO_2$ corresponding to the reaction product is deposited on the surface of the wafer W and a $SiO_2$ film (silicon oxide film) is formed on the wafer W surface.

Also, if necessary or desired, after the $SiO_2$ film has been formed to a predetermined thickness, by stopping the supply of the Si-containing gas from the reaction gas nozzle 31 but by continuously supplying the oxidizing gas from the reaction gas nozzle 32 and continuously rotating the turntable 2, a treatment process may be performed on the $SiO_2$ film.

By executing the film deposition process as described above, the $SiO_2$ film may be deposited in a via hole that is one example of a recessed pattern. The $SiO_2$ film that is first formed in the via hole has a cross-sectional shape substantially conforming to the recessed shape of the via hole.

Then, an etching process is performed. In the etching process, the $SiO_2$ film is etched to have a V-shaped cross-sectional shape. In the following, specific process steps of the etching process are described.

As illustrated in FIG. 2, the supply of the Si-containing gas and the oxidizing gas from the reaction gas nozzles 31 and 32 are stopped, and $N_2$ gas as a purge gas is supplied. The temperature of the turntable 2 is set to a temperature of about 600° C., for example, that is suitable for etching. The rotation speed of the turntable 2 is set to 60 rpm, for example. In such a state, by supplying $CF_4/Ar/O_2$ gas from the showerhead part 93 of the activated gas supply unit 90, and supplying $H_2/Ar$ gas from the hydrogen-containing gas supply part 96 at a preset flow rate, for example, the etching process is started.

Note that at this time, the turntable 2 is rotated at a relatively low speed such that the $SiO_2$ film may be etched to have a V-shaped cross-sectional shape. By etching the $SiO_2$ film in the via hole into a V-shape, a hole having a wide opening at its top portion may be formed in the $SiO_2$ film. Thus, when filling the hole with a $SiO_2$ film in a subsequent film deposition process, the $SiO_2$ can reach the bottom of the hole, thereby performing the film deposition process that has high bottom-up characteristics and can prevent void generation.

Note that when etching the $SiO_2$ film in the etching process, the etching amount is sometimes different between the rotational center side and the outer periphery side within the wafer W surface. When such a variation in the etching amount is created in the wafer W surface, it is difficult to secure etching uniformity in the wafer W surface.

However, the substrate processing apparatus according to the present embodiment includes the plasma generation chamber 91 arranged above the showerhead part 93, the pipe 94 that is capable of supplying a fluorine-containing gas to the showerhead part 93, and at least one hydrogen-containing gas supply part 96 that is provided at the pipe 94 and is capable of supplying a hydrogen-containing gas into the pipe 94.

The hydrogen-containing gas supplied into the pipe 94 from the hydrogen-containing gas supply part 96 reacts with F radicals contained in the fluorine-containing gas supplied from the plasma generation chamber 91 to the pipe 94 and the showerhead part 93, and produces HF. (hydrogen fluoride). In this way, the amount of F radicals contained in the fluorine-containing gas supplied into the pipe 94 and the shower head 93 is reduced, and an etching reaction principally based on F radicals can be adjusted to an etching reaction principally based on CF radicals.

Note that CF radicals as compared to F radicals have a characteristic of selectively etching a $SiO_2$ film over a SiN film or a Si film. Accordingly, in the substrate processing apparatus according to the present embodiment that includes the hydrogen-containing gas supply part 96, only a SiO$_2$ film can be selectively etched.

Also, by adjusting the position of the hydrogen-containing gas supply part 96 arranged at the pipe 94 and/or the flow rate of the hydrogen-containing gas supplied from the hydrogen-containing gas supply part 96, the in-plane distribution of the concentration of F radicals supplied from the showerhead part 93 to the space between the showerhead part 93 and the turntable 2 can be controlled. As a result, the etching amount distribution in the wafer W surface can be controlled.

Note that the controller 100 may control the flow rate of the hydrogen-containing gas supplied from the hydrogen-containing gas supply part 96 to a preset flow rate, or an operator of the substrate processing apparatus may control the flow rate, for example.

As described above, in the etching process, the turntable 2 is rotated consecutively a plurality of times while supplying the fluorine-containing gas and the hydrogen-containing gas into the vacuum chamber 1 but without supplying the first reaction gas and the second reaction gas into the vacuum chamber 1. In this way, the SiO$_2$ film is etched.

Then, the above-mentioned film deposition process is performed again. In this film deposition process, another SiO$_2$ film is deposited on the SiO$_2$ film that has been etched into a V-shape in the above etching process to increase the film thickness. Because a film is deposited on the SiO$_2$ film that has been etched into a V-shape, the opening of the hole in the SiO$_2$ film is not blocked during the film deposition such that the film is deposited from the bottom portion of the SiO$_2$ film.

Then, the above-mentioned etching process is performed again. In the etching process, the SiO$_2$ film is etched into a V-shape.

The above-described film deposition process and etching process may be alternately performed as many times as necessary to fill the via hole with the SiO$_2$ film while preventing the generation of a void in the SiO$_2$ film. The number of times these processes are repeated may be adjusted to a suitable number according to the shape of the recessed pattern (e.g. via hole) such as the aspect ratio of the recessed pattern. For example, the number of repetitions may be increased as the aspect ratio is increased. Also, the number of repetitions is expected to be greater when filling a trench with the SiO$_2$ film as compared to filling a via hole with the SiO$_2$ film, for example.

When repeating the film deposition process and the etching process in this manner, there may be many particles on the SiO$_2$ film. For example, according to a certain measurement, there was a case where the number of particles measured immediately after completing the etching process was 140, increased to 26,000 after 5 hours of the completion of etching, and decreased to 350 after 8 hours of the completion of etching. When performing the etching process using the fluorine-containing gas that contains CF$_4$ and the like on the film, a fluorine component remains on and in the etched film, and the remaining fluorine component can probably cause such particles.

Hence, by performing a treatment for removing the fluorine component remaining on and in the etched film, the particles can be prevented. To remove the remaining fluorine component, in the particle removal method according to the embodiment, the plasma generation chamber 91 converts the oxygen-containing gas such as Ar/C$_2$ to plasma, and activated Ar/O$_2$ gas is supplied to the showerhead part 93 through the pipe 94 while supplying hydrogen gas to activated Ar/C$_2$ gas from the hydrogen gas supply part 96, thereby supplying the mixed gas of activated Ar/O$_2$ gas and added hydrogen gas to the wafer W from the gas discharge holes 193. In the particle removal process, hydrogen is not activated in itself, but is influenced by radicals of activated Ar/C$_2$ gas, and then can be activated to some degree and go into a reactable state. Thus, it is assumed that fluorine, oxygen and hydrogen react with each other, and HF is formed and then released from the SiO$_2$ film in the end.

According to experiments by the inventors, in the arrangement of the gas discharge holes 193 of the showerhead part 93 illustrated in FIG. 6, when configuring the gas discharge hole 193*a* so as to be in communication with the plasma generation chamber 91 and the gas discharge holes 193*b* through 193*d* so as not to be in communication with the plasma generation chamber 91, and when hydrogen gas is supplied from the hydrogen gas supply part 96 through the pipe 94, the particles can be reduced. However, in the same structure, when hydrogen gas is supplied alone from the gas discharge holes 193*b* through 193*d*, the particles cannot be reduced. Hence, to obtain the effect of reducing the particles, adding hydrogen gas to the activated oxygen-containing gas is at least needed. Thus, hydrogen gas can acquire the needed reaction energy and can contribute to the removal of the remaining fluorine component.

Accordingly, a location where hydrogen is added can be set at any location where oxygen gas is activated, and the location where hydrogen is added is not necessarily limited to the hydrogen gas supply part 96 connected to the pipe 94. For example, as long as oxygen gas is kept sufficiently activated in the showerhead part 93, hydrogen may be supplied into the showerhead 93, or may be supplied into the plasma generation chamber 91.

More specifically, in the particle removal process, while rotating the turntable 2 holding the wafer W thereon, the oxygen-containing gas such as Ar/O$_2$ is supplied to the plasma chamber 91 from the gas supply pipe 92 (see FIG. 5), and Ar/O$_2$ gas is converted to plasma in the plasma generation chamber 91. When activated Ar/O$_2$ gas is supplied from the plasma generation chamber 91 to the showerhead part 93 through the pipe 94, hydrogen gas is added into the pipe 94 from the hydrogen gas supply pipe 96, and activated Ar/O$_2$ gas to which hydrogen is added is supplied to the showerhead part 93. Then, activated Ar/O$_2$ gas to which hydrogen gas is added is supplied from the gas discharge holes 193 provided in the bottom surface of the showerhead part 93 to the SiO$_2$ film deposited on the surface of the wafer W. Thus, the particles on the SiO$_2$ film are removed.

By performing such a particle removal process on the film after being etched, the remaining fluorine component on and within the film is removed, thereby removing the particles on the film.

After removing the particles, the gas supply from the activated gas supply unit 90 is stopped, and the rotation of the turntable 2 is stopped. The wafers W on the concave portions 24 of the turntable 2 are sequentially removed, and are carried out of the vacuum chamber. After carrying all of the wafers W out of the vacuum chamber 1, the substrate process ends.

Note that in the present embodiment, the film deposition process and the etching process are repeatedly performed to fill a recessed pattern that is formed in the surface of the wafer W with a film. However, the present invention is not limited thereto. For example, after performing the film deposition process continuously, only the etching process may be continuously performed, and then the particle removal process may be finally performed in this order.

Otherwise, a process of depositing a film on a wafer W having a flat surface to cover the whole surface, etching the film, and removing particles on the film, may be performed. As long as the particle removal process is performed after the etching process, the particle removal method and the substrate processing method according the present embodiments can be applied to a variety of processes.

Moreover, for example, a wafer W already having a film formed on its surface may be transferred and loaded in the substrate processing apparatus, and only the etching process and the particle removal process may be performed on the wafer W. Thus, as long as the particle removal process is performed after the etching process, any other process before the etching process and after the particle removal process can be combined to the etching process and the particle removal process depending on the intended use.

Figure 9:
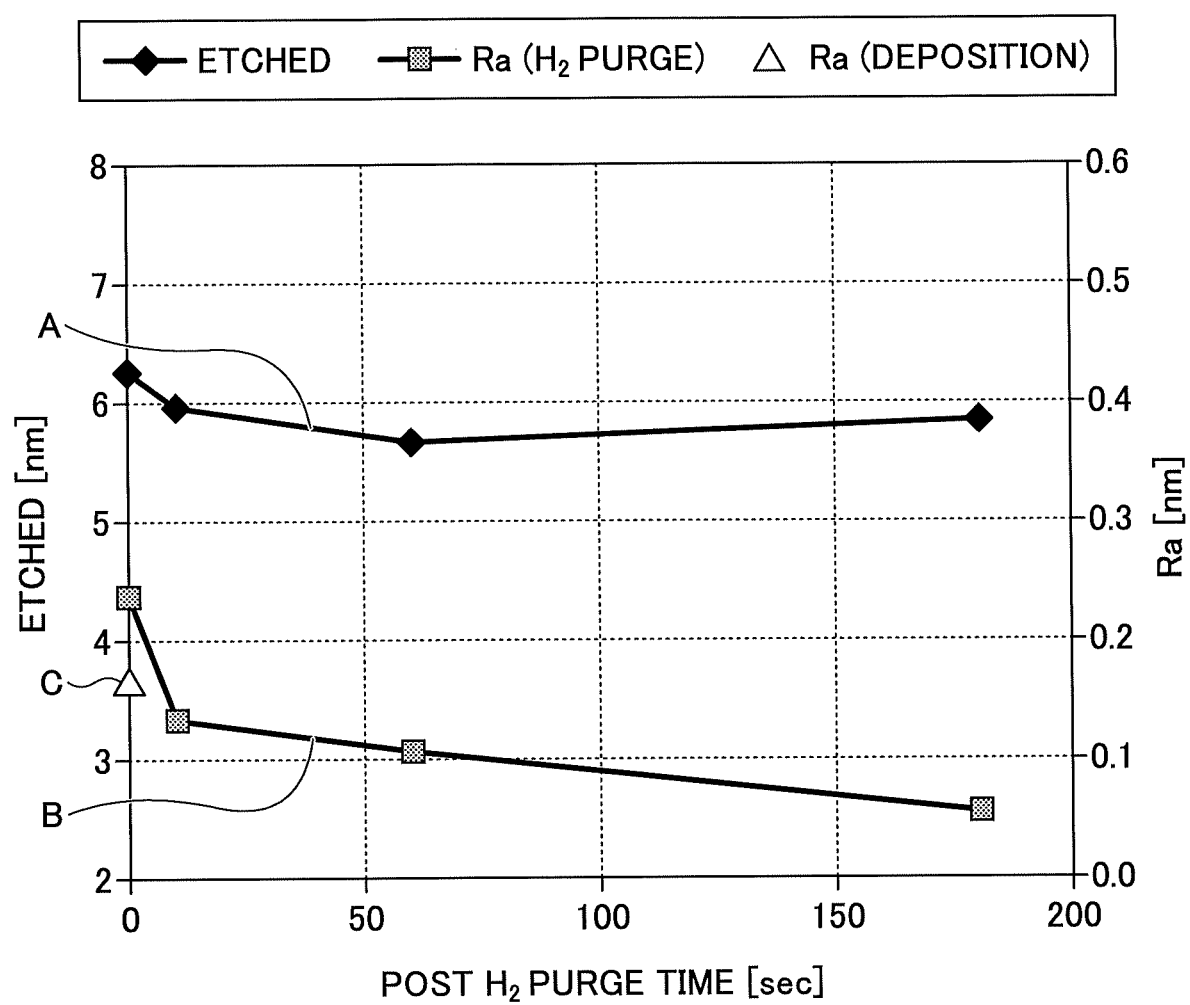
FIG. 9 is a chart showing a result of a working example of a particle removal method according to an embodiment of the present disclosure.

Next, a working example of the particle removal method according to the present embodiment is described below with reference to FIG. 9. FIG. 9 is a chart showing a result of the particle removal method of the working example.

In the working example in FIG. 9, the etching process and the particle removal process were performed sequentially. The substrate processing apparatus illustrated in FIGS. 1 through 6 and 8 was used in the working example. With respect to the etching conditions, the substrate temperature was set at 620° C.; the pressure in the vacuum chamber 1 was set at 1.3 Torr; and the rotational speed of the turntable 2 was set at 60 rpm. The etching was performed on a $SiO_2$ film having a thickness of 20 nm for 83 seconds so that the thickness of the $SiO_2$ film is decreased by 5 nm. The flow rate of $CF_4$, which is the fluorine-containing gas, was set at 10 sccm.

In the particle removal process, the conditions were set at the same as those of the etching process: the substrate temperature was set at 620° C., the pressure in the vacuum chamber 1 was set at 1.3 Torr, and the rotational speed of the turntable 2 was set at 60 rpm. The flow rate of activated $Ar/O_2$ gas supplied from the showerhead part 93 was set at 3500/100 sccm, and the flow rate of hydrogen gas supplied from the gas showerhead part 93 that was originally supplied from the hydrogen gas supply part 96 by being added to the pipe 94, was set at 30 sccm.

In FIG. 9, the horizontal axis indicates a supply period of time of hydrogen in the particle removal process (seconds), and the vertical axis indicates an etching amount (nm) of a film and average surface roughness Ra (nm) of the film. A curve A indicates characteristics of the etching amount, and a curve B indicates characteristics of the average surface roughness B. A point C indicates the average surface roughness of the film when only the film deposition was performed. Here, the average surface roughness Ra was observed and calculated using an atomic force microscope (AFC).

To begin with, as shown by the curve A, the etching amount was set at 6 nm that was almost constant. At that time, the average surface roughness Ra of the $SiO_2$ film was about 0.4, which was almost constant. Because the average surface roughness Ra of the film when only the film deposition was performed was about 0.17 as shown by the point C, it is noted that the average surface roughness Ra increased more than twice by etching the film such that the film thickness is decreased by about 6 nm after the film deposition.

As shown by the curve B, when the mixed gas produced by adding hydrogen gas to the activated oxygen-containing gas ($Ar/O_2$) was supplied to the etched film, the average surface roughness Ra decreased over time. In particular, the average surface roughness Ra widely decreased for about first ten seconds. Thus, the result indicates that the average surface roughness Ra and the particles can be reduced by performing the particle removal method of the working example.

As discussed above, according to the particle removal method and the substrate processing method according to the embodiments can reduce particles on a film after being etched.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A particle removal method for removing particles on a film etched using a fluorine-containing gas, comprising:
   supplying a mixed gas of an activated oxygen-containing gas and inactivated hydrogen gas added to the activated oxygen-containing gas to the etched film.

2. The particle removal method according to claim 1, wherein the oxygen-containing gas contains argon.

3. The particle removal method according to claim 1, wherein the fluorine-containing is a fluorocarbon-based gas that contains carbon.

4. The particle removal method according to claim 1,
   wherein the etched film is a film deposited on a substrate,
   wherein the substrate is accommodated in a process chamber,
   wherein a gas discharge unit configured to supply a gas into the process chamber is connected to a plasma generation chamber provided outside the process chamber through a pipe, and
   wherein the step of supplying the mixed gas to the etched film comprises steps of:
   generating the activated oxygen-containing gas by activating an oxygen-containing gas in the plasma generation chamber;
   supplying the activated oxygen-containing gas toward the process chamber through the pipe; and
   producing the mixed gas by supplying hydrogen gas into the pipe to add hydrogen gas to the activated oxygen-containing gas in the pipe before supplying the mixed gas to the etched film from the gas discharge unit.

5. The particle removal method according to claim 4,
   wherein the substrate is arranged on a surface of a turntable provided in the process chamber along a circumferential direction of the turntable,
   wherein the gas discharge unit is provided at a predetermined location in the circumferential direction, and
   wherein the step of supplying the mixed gas to the etched film is performed by rotating the turntable so as to pass a location under the gas discharge unit that supplies the mixed gas to the etched film.

6. The particle removal method according to claim 4,
   wherein the gas discharge unit is configured as a showerhead, and
   wherein the step of supplying the mixed gas to the etched film comprises supplying the mixed gas to the etched film from a gas discharge hole provided in a bottom surface of the showerhead.

7. A substrate processing method, comprising steps of:
etching a film deposited on a substrate by supplying a fluorine-containing gas to the film; and
removing a particle on the etched film by supplying a mixed gas of an activated oxygen-containing gas and inactivated hydrogen gas added to the activated oxygen-containing gas to the etched film.

8. The substrate processing method according to claim 7,
wherein the substrate is accommodated in a process chamber,
wherein a gas discharge unit configured to supply a gas into the process chamber is connected to a plasma generation chamber provided outside the process chamber through a pipe, and
wherein the step of supplying the mixed gas to the etched film comprises steps of:
generating the activated oxygen-containing gas by activating an oxygen-containing gas in the plasma generation chamber;
supplying the activated oxygen-containing gas toward the process chamber through the pipe; and
producing the mixed gas by supplying hydrogen gas into the pipe to add hydrogen gas to the activated oxygen-containing gas in the pipe before supplying the mixed gas to the etched film from the gas discharge unit.

9. The substrate processing method according to claim 8,
wherein the substrate is arranged on a surface of a turntable provided in the process chamber along a circumferential direction of the turntable,
wherein the gas discharge unit is provided at a predetermined location in the circumferential direction, and
wherein the step of supplying the mixed gas to the etched film is performed by rotating the turntable so as to pass a location under the gas discharge unit that supplies the mixed gas to the etched film.

10. The substrate processing method according to claim 9,
wherein the gas discharge unit is configured as a showerhead, and
wherein the step of supplying the mixed gas to the etched film comprises supplying the mixed gas to the etched film from a gas discharge hole provided in a bottom surface of the showerhead.

11. The substrate processing method according to claim 9, further comprising:
depositing the film on the substrate to be etched before the step of etching the film.

12. The substrate processing method according to claim 11,
wherein the step of depositing the film comprises:
adsorbing a source gas on the substrate by supplying the source gas to the substrate;
producing a reaction product on the substrate by supplying a reaction gas capable of producing the reaction product by reacting with the source gas; and
modifying the reaction product on the substrate by supplying a treatment gas activated in the plasma generation chamber to the reaction product from the gas discharge unit, the treatment gas being the same kind of gas as the reaction gas.

13. The substrate processing method according to claim 12,
wherein the process chamber includes a source gas supply unit that supplies the source gas to the substrate, a reaction gas supply unit that supplies the reaction gas to the substrate, and the gas discharge unit that supplies the treatment gas that are provided above the turntable and along a rotational direction of the turntable in this order,
wherein the steps of adsorbing the source gas on the substrate, producing the reaction product on the substrate, and modifying the reaction product on the substrate are performed by rotating the turntable such that the substrate passes locations under the source gas unit, the reaction gas supply unit, and the gas discharge unit in this order.

* * * * *